United States Patent [19]
Reinke

[11] 4,361,771
[45] Nov. 30, 1982

[54] VOLTAGE SUMMATION CIRCUIT

[75] Inventor: Thomas R. Reinke, Robbinsdale, Minn.

[73] Assignee: Honeywell Inc., Minneapolis, Minn.

[21] Appl. No.: 209,618

[22] Filed: Nov. 24, 1980

[51] Int. Cl.³ .......................... H03F 3/72; H03F 3/16
[52] U.S. Cl. .................................. 307/497; 307/246; 307/353; 330/288; 328/159
[58] Field of Search ................ 330/288; 307/246, 352, 307/353, 497; 328/159

[56] References Cited
U.S. PATENT DOCUMENTS

| | | | |
|---|---|---|---|
| 3,745,383 | 7/1973 | Sangster | 307/246 |
| 3,835,410 | 9/1974 | Wittlinger | 330/288 |
| 4,172,999 | 10/1979 | Leidich | 330/288 |
| 4,216,393 | 8/1980 | Gillberg et al. | 330/288 |
| 4,323,796 | 4/1982 | Lathrope | 307/353 |

*Primary Examiner*—John S. Heyman
*Attorney, Agent, or Firm*—Theodore F. Neils

[57] ABSTRACT

A voltage summation circuit receives a series of input voltage signals and provides an output voltage signal which represents a summation of the input voltage signals. The voltage summation circuit includes first and second capacitors, a current mirror, and an input switch. During a first clock phase of each cycle in which an input voltage signal is received, the input switch connects the first capacitor to the input to charge the first capacitor as a function of the input voltage signal. During a second clock phase the input switch connects the first capacitor to the current mirror to discharge the first capacitor. The current mirror is connected to the second capacitor, so that the change in charge on the first capacitor during the second clock phase results in a similar change in charge on the second capacitor. The charging and discharging of the first capacitor during the first and second clock phases is repeated for each input voltage signal. The total change in charge on the second capacitor, and thus the total change in the output voltage signal, represents a summation of the input voltage signals.

16 Claims, 2 Drawing Figures

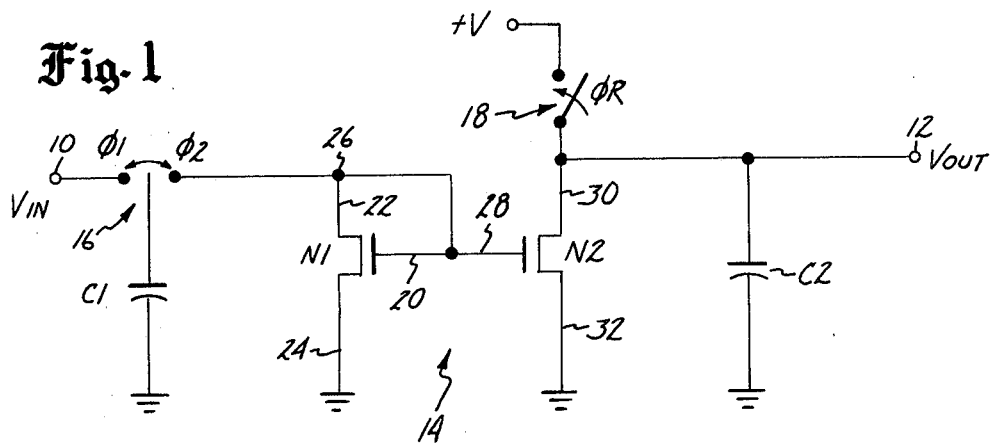
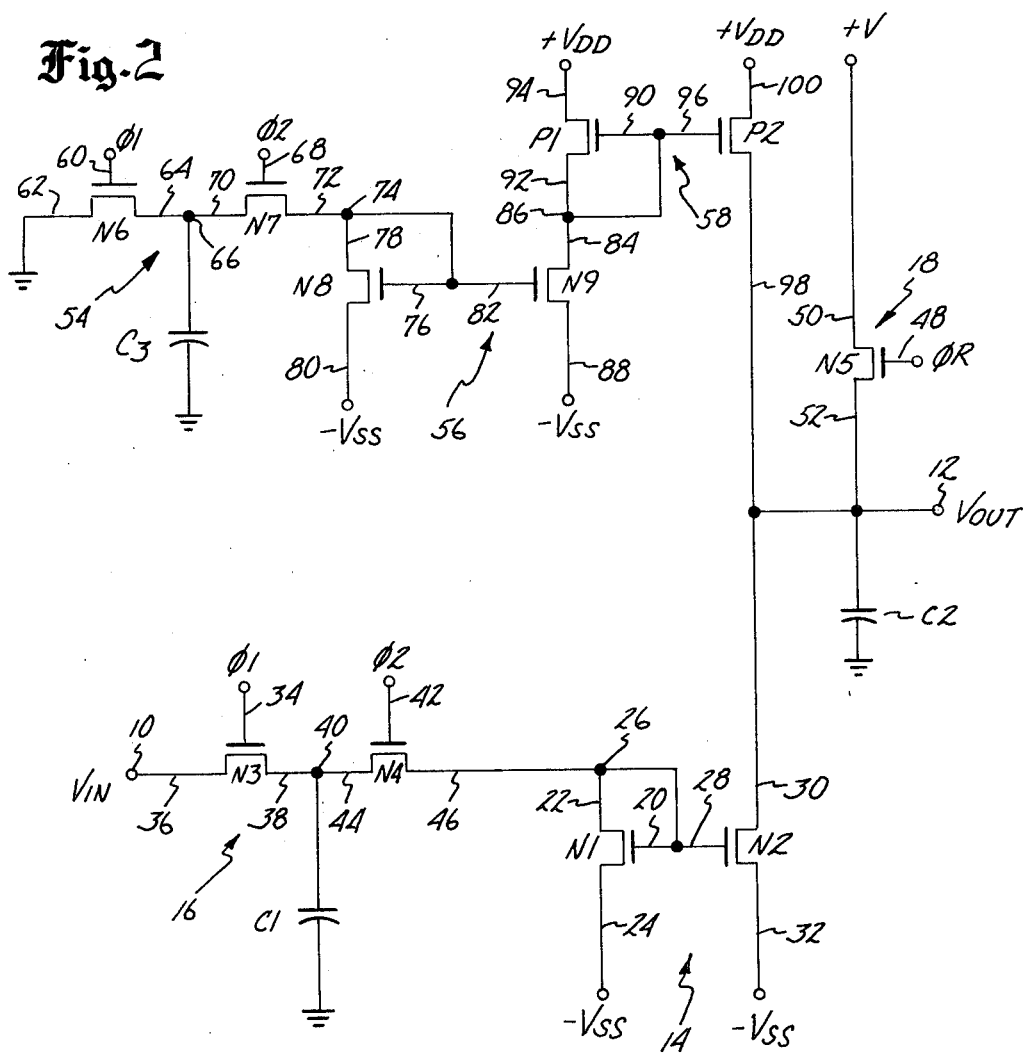

VOLTAGE SUMMATION CIRCUIT

BACKGROUND OF THE INVENTION

1. Field of the Invention

The present invention relates to analog electrical circuits. In particular, the present invention is a circuit for summation of analog voltages.

2. Description of the Prior Art

A common function to be performed in analog electrical systems is voltage summation. Various circuits have been developed in the past to provide this function. The most common type of circuitry uses an operational amplifier. For example, one typical type of voltage summation circuit includes an operational amplifier having a capacitor connected between its output terminal and its non-inverting input terminal. The input voltage is supplied through a resistor to the non-inverting input of the operational amplifier, and the inverting input of the operational amplifier is connected to ground. The output voltage appearing at the output of the operational amplifier represents a summation of the input voltage signals supplied to the circuit. In the design of integrated circuits, it is advantageous to minimize the number of components, and thus the size of the integrated circuit. A voltage summation circuit having a smaller component count than an operational amplifier circuit would be particularly advantageous for analog integrated circuits requiring a voltage summation function.

SUMMARY OF THE INVENTION

The present invention is a summation circuit which receives a series of input signals and provides an output signal which is representative of a summation of the input signals. The summation circuit includes an input, an output, first and second capacitor means, current mirror means, and first switching means. For each input signal, the first switching means connects the input and the first capacitor means to provide a charge on the first capacitor means which is a function of the input signal, and then connects the first capacitor means and the current mirror to provide a first current which is a function of the first charge on the first capacitor means.

The current mirror means is connected to the second capacitor and provides a second current which is a function of the first current. The second capacitor means has a second charge which is changed as a function of the second current, so that the change in the second charge, and thus the output signal, represents a summation of the series of input signals.

BRIEF DESCRIPTION OF THE DRAWINGS

FIG. 1 is an electrical schematic diagram of a preferred embodiment of the voltage summation circuit of the present invention.

FIG. 2 is an electrical diagram of another preferred embodiment of the present invention.

DETAILED DESCRIPTION OF THE PREFERRED EMBODIMENTS

FIG. 1 shows a basic voltage summation circuit in accordance with the present invention. The voltage summation circuit of FIG. 1 includes input terminal 10 at which a series of input voltage signals ($V_{IN}$) are received during successive operating cycles, and output terminal 12 at which an output voltage signal ($V_{OUT}$) is supplied. The voltage summation circuit includes first capacitor C1, second capacitor C2, current mirror 14 formed by first and second MOS n-channel enhancement type transistors N1 and N2, switch 16, and charge initializing switch 18.

Transistors N1 and N2 are connected in a current mirror configuration. Transistor N1 has gate 20 and drain 22 connected together and source 24 connected to ground. Gate 20 and drain 22 are connected to circuit node 26. Transistor N2 has gate 28 connected to circuit node 26, drain 30 connected to output terminal 12, and source 32 connected to ground. Since transistors N1 and N2 have their gates 20 and 28 connected together and their sources 24 and 32 connected together, transistor N2 conducts a current identical to the current in transistor N1 when output terminal 12 is constrained so as to keep transistor N2 in saturation. In other words, the current flowing between drain 22 and source 24 of transistor N1 is mirrored by the current flowing between drain 30 and source 32 of transistor N2.

Switch 16 switches to connect capacitor C1 alternately to input terminal 10 and to circuit node 26. During a first clock phase ($\phi1$), switch 16 connects capacitor C1 to input terminal 10 so that capacitor C1 is charged to the input voltage $V_{IN}$. During the next clock phase ($\phi2$), switch 16 connects capacitor C1 to circuit node 26 to permit capacitor C1 to discharge through transistor N1. During second clock phase $\phi2$, capacitor C1 is discharged from its stored voltage $V_{IN}$ to voltage $V_{TN}$.

Since transistors N1 and N2 are connected in a current mirror configuration, transistor N2 mirrors the current flowing through transistor N1. During first clock phase $\phi1$, no current flows through transistor N2, and the charge on capacitor C2 is unchanged. During second clock phase $\phi2$, transistor N1 conducts a discharge current from capacitor C1, and transistor N2 conducts a mirror current which similarly discharges capacitor C2. With the voltage summation circuit of the present invention, the charge removed ($\Delta Q_1$) from capacitor C1 during second clock phase $\phi2$ of each cycle is equal to the charge removed ($\Delta Q_2$) from capacitor C2 during second clock phase $\phi2$ of that cycle. In other words, for each cycle (n):

$$\Delta Q_{2n} = -C1\,(V_{IN_n} - V_{TN}). \qquad \text{Equation 1}$$

The voltage change at output terminal 12 for that cycle is then:

$$\Delta V_{OUT_n} = -\frac{C1}{C2}\,(V_{IN_n} - V_{TN}). \qquad \text{Equation 2}$$

As each successive input voltage $V_{IN}$ is supplied to input terminal 10 and each cycle is repeated with capacitor C1 being charged during clock phase $\phi1$ and discharged during clock phase $\phi2$, the total voltage change $\Delta V_{OUT}$ at output terminal 12 is:

$$\Delta V_{OUT} = \sum_{n=1}^{m} -\frac{C1}{C2}\,(V_{IN_n} - V_{TN}). \qquad \text{Equation 3}$$

where a total of m values of $V_{IN}$ are successively applied to input terminal 10 for summation.

In the embodiment shown in FIG. 1, charge initializing switch 18 provides an initial charge to capacitor C2. This charge is reduced during successive cycles by the discharge currents which flow through transistor N2. In this embodiment, initializing switch 18 is closed during a reset clock phase $\phi R$ which precedes each summation operation to charge capacitor C2 to an initial output voltage $V_{OUT} = +V$. During summation cycles in which successive input voltages $V_{IN}$ are supplied to input terminal 10, initializing switch 18 is open.

In the embodiment shown in FIG. 1, a DC term $V_{TN}$ is present in the voltage summation shown in Equation 3. The circuit of FIG. 2 is a preferred embodiment of the present invention which eliminates the DC term $V_{TN}$ from the output voltage summation signal $\Delta V_{OUT}$. The circuit of FIG. 2 utilizes the basic voltage summation circuit shown in FIG. 1, and similar components are designated by similar reference characters. All transistors shown in the preferred embodiment of FIG. 2 are enhancement type MOS transistors.

In the circuit of FIG. 2, the input voltage signals $V_{IN}$ are supplied at input terminal 10. Switch 16 is formed by n-channel MOS transistors N3 and N4. Transistor N3 has its gate 34 connected to receive $\phi 1$ clock pulses, its drain 36 connected to input terminal 10, and its source 38 connected to capacitor C1 at node 40. Transistor N4 has its gate 42 connected to receive $\phi 2$ clock pulses, its drain 44 connected to capacitor C1 at node 40, and its source 46 connected to first current mirror 14 at node 26. During first clock phase $\phi 1$, transistor N3 is conductive and connects capacitor C1 to input terminal 10, while transistor N3 is non-conductive. During second clock phase $\phi 2$, transistor N4 is conductive to connect capacitor C1 to node 26, while transistor N3 is non-conductive.

Capacitor C2 is connected to output terminal 12 and to drain 30 of transistor N2. As charge is removed from capacitor C1 during second clock phase $\phi 2$, a similar amount of charge is being removed from capacitor C2 through transistor N2. This portion of the circuit of FIG. 2 is similar to the circuit of FIG. 1, except that sources 24 and 32 of transistors N1 and N2 are connected to a negative supply voltage $-V_{SS}$ rather than to ground, as in FIG. 1.

Initializing switch 18 is an n-type MOS transistor switch N5. Gate 48 of transistor N5 is connected to receive the $\phi R$ reset pulses, drain 50 is connected to the $+V$ supply voltage, and source 52 is connected to output terminal 12 and capacitor C2.

The remaining circuitry shown in FIG. 2 is a reference summation circuit which provides current which cancels the DC term $V_{TN}$ in the output signal $V_{OUT}$. The reference summation circuit includes capacitor C3, second switch 54, second current mirror 56, and third current mirror 58.

Second switch 54 is formed by n-channel MOS transistor switches N6 and N7. Transistor N6 has its gate 60 connected to receive the $\phi 1$ clock pulses, its drain 62 connected to a reference potential (in this case ground), and its source connected to capacitor C3 at node 66. Transistor N7 has its gate 68 connected to receive the $\phi 2$ clock pulses, its drain 70 connected to capacitor C3 at node 66, and its source 72 connected to second current mirror 56 at node 74.

Second current mirror 56 is formed by MOS n-channel transistors N8 and N9. Transistor N8 has its gate 76 and drain 78 connected to circuit mode 74, and has its source 80 connected to the $-V_{SS}$ supply voltage. Transistor N9 has its gate 82 connected to circuit node 74, its drain 84 connected to third current mirror 58 at node 86, and its source 88 connected to the $-V_{SS}$ supply voltage.

Third current mirror 58 is formed by a pair of MOS p-channel transistors P1 and P2. Transistor P1 has its gate 90 and drain 92 connected to drain 84 of transistor N9 at node 86. Source 94 of transistor P1 is connected to a positive supply voltage ($+V_{DD}$), which is preferably a higher potential than voltage $+V$. Transistor P2 has its gate 96 connected to gate 90 of transistor P1, its drain 98 connected to output terminal 12, and its source 100 connected to the $+V_{DD}$ supply voltage.

Second switch 54 connects capacitor C3 to ground during first clock phase $\phi 1$ and connects capacitor C3 to node 74 during second clock phase $\phi 2$. During second clock phase $\phi 2$, capacitor C3 is discharged through transistor N8 to the $-V_{SS}$ terminal. The current flow through transistor N8 is mirrored in transistor N9. The current through transistor N9 is supplied through transistor P1 and is mirrored by transistor P2. As a result, the reference summation circuit adds a fixed amount of charge ($\Delta Q_3$) to output terminal 12 during each cycle (n). That amount of charge is:

$$\Delta Q_{3n} = C_3(V_{SS} - V_{TN}). \qquad \text{Equation 4}$$

The charge removed from capacitor C2 due to the charging and discharging of capacitor C1 during each cycle (n) is:

$$\Delta Q_{1n} = -C_1(V_{INn} + V_{SS} - V_{TN}). \qquad \text{Equation 5}$$

In the preferred embodiments of the present invention, the capacitance of C1 equals the capacitance of C3, and therefore the total net change in charge on capacitor C2 during each cycle is:

$$\Delta Q_{2n} = \Delta Q_{1n} + \Delta Q_{3n} = -C_1 V_{INn}. \qquad \text{Equation 6}$$

The summation process is repeated over a total of m cycles, the total voltage change $\Delta V_{OUT}$ is:

$$\Delta V_{OUT} = \sum_{n=1}^{m} -\frac{C_1}{C_2} V_{INn}. \qquad \text{Equation 7}$$

It can be seen, therefore, that the change in output $\Delta V_{OUT}$ at terminal 12 is representative of a summation of the series of input voltage signals $V_{IN}$ supplied at input terminal 10, and that the DC voltage terms $V_{SS}$ and $V_{TN}$ are cancelled by the use of the reference summation circuit in the circuit of FIG. 2.

The present invention offers significant advantages over prior art voltage summation circuits using operational amplifiers. All of the components of the circuits of the present invention are capable of fabrication on a single integrated circuit chip. The total component count of the circuit of the present invention is significantly lower than an operational amplifier circuit and results in a smaller integrated circuit for performing the voltage summation function.

Although the preferred embodiments of the present invention illustrated in FIGS. 1 and 2 primarily utilize n-channel MOS transistors, p-channel MOS transistors may be used in place of n-channel MOS transistors, and vice versa, by properly selecting the proper polarity of supply voltages.

In other preferred embodiments of the present invention, the voltage supplied to drain 62 of transistor N6 is a series of second input voltage signals rather than a reference voltage such as ground potential. In these embodiments the total change in the output at terminal 12 is a summation of the difference of the series of input voltage signals supplied to capacitors C1 and C3.

Although the present invention has been described with reference to preferred embodiments, workers skilled in the art will recognize that changes may be made in form and detail without departing from the spirit and scope of the invention.

What is claimed is:

1. A summation circuit for providing an output signal which represents a summation of a series of first input signals, the summation circuit comprising:
    first capacitor means;
    second capacitor means, the output signal being a function of a charge on the second capacitor means;
    means for charging the first capacitor means as a function of each first input signal;
    means for discharging the first capacitor means to provide a first current which is a function of each first input signal; and
    means for providing a second current which is a function of the first current, and being connected to the second capacitor means to control the charge on the second capacitor means as a function of the second current.

2. The summation circuit of claim 1 and further comprising:
    reference circuit means connected to the second capacitor means for providing a reference current which does not vary as a function of the input signal, wherein the charge on the second capacitor means is a function of the second current and the reference current.

3. The summation circuit of claim 1 and further comprising:
    third capacitor means;
    means for charging the third capacitor means as a function of a second input signal;
    means for discharging the third capacitor means to provide a third current which is a function of the second input signal; and
    means for providing a fourth current which is a function of the third current, and being connected to the second capacitor means to control charge on the second capacitor means as a function of the fourth current.

4. The summation circuit of claim 3 wherein the second input signal is a reference signal.

5. The summation circuit of claim 3 wherein one of the second and fourth currents discharges the second capacitor means and the other of the second and fourth currents charges the second capacitor means.

6. The summation circuit of claim 1 wherein the series of first input signals are received at an input terminal during a series of cycles, respectively, and wherein the means for charging the first capacitor means charges the first capacitor means during a first clock phase of each cycle, and wherein the means for discharging the first capacitor means discharges the first capacitor means during a second clock phase of each cycle.

7. The summation circuit of claim 6 wherein the means for charging and the means for discharging comprise first switching means which connect the first capacitor means and the input terminal during the first clock phase, and which connect the first capacitor means and the means for providing a second current during the second clock phase.

8. The summation circuit of claim 1 and further comprising:
    initializing means connected to the second capacitor means for providing an initial charge on the second capacitor means prior to summation of the series of first input signals.

9. The summation circuit of claim 1 wherein the means for providing a second current comprises a first current mirror having a first current path through which the first current flows when the first capacitor means is discharged, and a second current path connected to the second capacitor means for changing the charge on the second capacitor means as a function of the second current which is mirror of the first current.

10. A summation circuit for providing an output signal which represents a summation of a series of input signals, the summation circuit comprising:
    an input for receiving the series of input signals during a series of cycles, respectively;
    first capacitor means;
    first current mirror means having a first current path through which a first current flows and a second current path through which a second current flows which is a function of the first current;
    first switching means for connecting the input and the first capacitor means during a first phase of each cycle to provide a charge on the first capacitor means which is a function of the input signal, and for connecting the first capacitor means and the first current path of the first current mirror means during a second phase of each cycle to provide the first current; and
    second capacitor means connected to the second current path and to the output, the output signal being a function of charge on the second capacitor means, and wherein the second current during each cycle changes charge on the second capacitor means as a function of the input signal received at the input during the cycle.

11. The summation circuit of claim 10 and further comprising:
    initializing means connected to the second capacitor means for providing an initial charge on the second capacitor means prior to summation of the series of input signals, and wherein a change in charge on the second capacitor means from the initial charge is representative of a summation of the series of input signals.

12. The summation circuit of claim 10 wherein the first current mirror means comprises first and second MOS transistors, the first transistor having a drain and a source forming the first current path and having a gate, the second transistor having a drain and a source forming the second current path and a gate connected to the gate of the first transistor.

13. The summation circuit of claim 12 wherein the first and second transistors have their sources connected to a common potential and have their gates connected to the drain of the first transistor.

14. The summation circuit of claim 10 and further comprising:
    reference circuit means connected to the second capacitor means for providing a reference current during each cycle which does not vary as a function of the input signal, wherein the change in charge on the second capacitor means during each cycle is a function of the second current and the reference current.

15. The summation circuit of claim 14 wherein one of the second and reference currents discharges the second capacitor means and the other of the second and reference currents charges the second capacitor means.

16. The summation circuit of claim 14 wherein the reference circuit means comprises:
   third capacitor means;
   reference current mirror means for providing the reference current as a function of a third current;
   second switch means for connecting the third capacitor means to a reference potential during the first phase of each cycle and connecting the third capacitor means to the reference current mirror means during the second phase of each cycle to provide the third current.

* * * * *